United States Patent [19]
Taylor et al.

[11] Patent Number: 6,165,674
[45] Date of Patent: *Dec. 26, 2000

[54] POLYMERS AND PHOTORESIST COMPOSITIONS FOR SHORT WAVELENGTH IMAGING

[75] Inventors: Gary N. Taylor, Marlborough; George G. Barclay, Allston; Charles R. Szmanda, Westborough, all of Mass.

[73] Assignee: Shipley Company, L.L.C., Marlborough, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 09/007,617

[22] Filed: Jan. 15, 1998

[51] Int. Cl.⁷ ........................................ G03F 7/004
[52] U.S. Cl. .................. 430/270.1; 430/905; 430/910
[58] Field of Search ................................ 430/270.1, 905, 430/910

[56] References Cited

U.S. PATENT DOCUMENTS

| | | | |
|---|---|---|---|
| 4,491,628 | 1/1985 | Ito et al. ................................. | 430/176 |
| 4,810,613 | 3/1989 | Osuch et al. ............................. | 523/192 |
| 4,883,740 | 11/1989 | Schwalm et al. ...................... | 430/270.1 |
| 4,968,581 | 11/1990 | Wu et al. ................................. | 430/192 |
| 4,983,495 | 1/1991 | Tsutsumi et al. ...................... | 430/270.1 |
| 5,064,746 | 11/1991 | Schwalm ............................... | 430/270.1 |
| 5,075,199 | 12/1991 | Schwalm et al. ...................... | 430/281.1 |
| 5,399,647 | 3/1995 | Nozaki .................................... | 526/297 |
| 5,527,659 | 6/1996 | Yamaoka et al. ..................... | 430/270.1 |
| 5,585,219 | 12/1996 | Kaimoto et al. ...................... | 430/270.1 |
| 5,587,274 | 12/1996 | Kishida et al. ....................... | 430/270.1 |
| 5,607,824 | 3/1997 | Fahey et al. ........................... | 430/510 |
| 5,660,969 | 8/1997 | Kaimoto ............................... | 430/270.1 |
| 5,693,691 | 12/1997 | Flaim et al. ........................... | 523/436 |
| 5,707,784 | 1/1998 | Oikawa et al. ....................... | 430/313 |
| 5,725,994 | 3/1998 | Kondo .................................... | 430/270.1 |
| 5,731,123 | 3/1998 | Kawamura et al. .................. | 430/176 |

FOREIGN PATENT DOCUMENTS

| | | |
|---|---|---|
| 0 663 616 | 7/1995 | European Pat. Off. . |
| 196 26 003 A1 | 1/1997 | Germany . |

*Primary Examiner*—John S. Chu
*Attorney, Agent, or Firm*—S. Matthew Cairns; Peter F. Corless; Darryl P. Frickey

[57] ABSTRACT

The present invention provides novel polymers and photoresist compositions that comprise the polymers as a resin binder component. The photoresist compositions of the invention can provide highly resolved relief images upon exposure to extremely short wavelengths, including well-resolved 0.25 micron features imaged at 193 nm. Polymers of the invention include those that comprise a photogenerated acid-labile unit that includes a cyano moiety, as well as polymers that contain cyano and itaconic anhydride moieties in combination.

22 Claims, No Drawings

POLYMERS AND PHOTORESIST COMPOSITIONS FOR SHORT WAVELENGTH IMAGING

BACKGROUND OF THE INVENTION

1. Field of the Invention

The present invention relates to new polymers and use of such polymers as a resin binder component for photoresist compositions, particularly chemically-amplified positive-acting resists that can be imaged at extremely short wavelengths such as 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer.

While currently available photoresists are suitable for many applications, current resists also can exhibit significant shortcomings, particularly in high performance applications such as formation of highly resolved sub-half micron and sub-quarter micron features.

In this regard, photoresists that could be successfully imaged at extremely short wavelengths such as 193 nm (provided by an ArF exposure tool) would be highly desirable. Use of such short exposure wavelengths can enable formation of smaller features. Accordingly, a photoresist that yields well-resolved images upon 193 nm exposure could enable formation of extremely small (e.g. sub-0.25 $\mu$m) features that respond to constant industry demands for smaller dimension circuit patterns, e.g. to provide greater circuit density and enhanced device performance.

However, current photoresists are generally designed for imaging at relatively higher wavelengths, such as I-line (365 nm) and G-line (436 nm) exposures. Even advanced resist products, such as those imaged with a KrF laser (ca. 248 nm), utilize exposure wavelengths that are substantially higher than 193 nm.

Such current photoresists are generally unsuitable for imaging at 193 nm. In particular, prior resists exhibit poor resolution (if any image at all can be developed) upon exposure to 193 nm. Among other things, current photoresists can be highly opaque to extremely short exposure wavelengths such as 193 nm, thereby resulting in poorly resolved images. Efforts to enhance transparency at 193 nm can result in resists that exhibit poor substrate adhesion, which in turn can dramatically compromise image resolution.

It thus would be desirable to have new photoresist compositions, particularly resist compositions that can be imaged at 193 nm. It would be particularly desirable to have such resist compositions that exhibit good adhesion to underlying substrate surfaces and can provide well-resolved sub-0.25 $\mu$m relief images.

SUMMARY OF THE INVENTION

The present invention provides novel polymers and photoresist compositions that comprise the polymers as a resin binder component.

The photoresist compositions of the invention can provide highly resolved relief images upon exposure to extremely short wavelengths, particularly 193 nm. The photoresists of the invention preferably are chemically-amplified positive resists, which utilize photoacid-induced cleavage of pendant polymer groups to provide solubility differentials between exposed and unexposed areas of a resist coating layer.

Polymers of the invention in general comprise one or more repeating units that include a cyano group.

Preferably polymers of the invention are substantially free of any phenyl or other aromatic groups. For example, preferred polymers contain less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists of the invention.

Polymers of the invention also impart excellent properties upon use as a resin binder component of a photoresist composition imaged at 193 nm. For example, preferred resists of the invention exhibit good adhesion to an underlying substrate surface, such as a silicon wafer or other microelectronic wafer surface, a glass or plastic flat panel display surface, an antireflective coating (ARC), etc. Preferred resists also exhibit good resolution upon development (e.g., vertical sidewalls, no feature swelling), even at sub-0.25 μm feature sizes.

In greater detail, in one aspect of the invention, polymers are provided that comprise a photogenerated acid-labile unit that includes a cyano moiety.

For example, suitable units include those that contain a cyano group, such as units of the following Formula I:

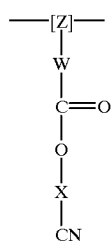

(I)

wherein W is a linker group and may be e.g. a chemical bond, optionally substituted alkane (alkylene) preferably having from 1 to about 3 or 4 carbons, and the like;

X is suitably an optionally substituted alkane group (alkylene), preferably having 1 to about 8 carbon atoms, more preferably 1, 2 or 3 carbons; optionally substituted alkenylene preferably having 2 to about 8 carbons; or optionally substituted alkynylene preferably having 2 to about 8 carbon atoms;

Z is a bridge group between polymer units, e.g. a group of the following formula (a):

(a)

$$-\!\!\left[\!\begin{array}{cc} R^1 & R^2 \\ | & | \\ C\!-\!-\!C \\ | & | \\ & R^3 \end{array}\!\right]\!\!-$$

wherein $R^1$, $R^2$ and $R^3$ independently each may be e.g hydrogen, optionally substituted alkyl typically having from 1 to about 8 carbons, more typically 1, 2 or 3 carbons with methyl being preferred, and the like. Particularly preferred Z bridge groups include those of the following formula (b):

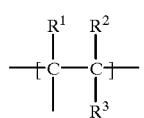

(b)

wherein $R^4$ is hydrogen or optionally substituted alkyl, preferably $C_{1-3}$ alkyl, more preferably methyl. Such groups of formulae (a) and (b) can be provided by condensation of appropriate acrylate monomers.

In another aspect of the invention, polymers are provided that comprise both cyano and itaconic anhydride groups. Preferably, the itaconic anhydride moiety will be directly pendant to the polymer backbone, i.e. the moiety is directly pendant to a polymer bridge group (such as Z as defined above for Formula I) without any alkylene, aryl or other group interposed between the polymer bridge group and the itaconic anhydride group. In this aspect of the invention, if desired, a cyano group need not be included on acid-labile groups of the polymer. Thus, a cyano group also may be suitably directly pendant to the polymer backbone, although a linker group also may be interposed between the cyano group and a polymer bridge group.

Generally preferred polymers of the invention that contain both cyano and itaconic anhydride moieties include polymers that contain repeating units of the following Formula II:

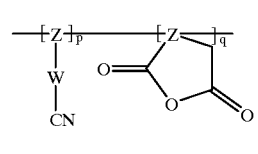

II wherein Z and W is the same as defined above for Formula I, and preferably W in Formula II is a chemical bond or $C_{1-3}$ alkane (alkylene); and p and q are each mole fractions or percents of the respective cyano and itaconic anhydride units of the polymer. Preferably, p and q are each at least about 2 or 3 mole percent, more preferably p and q are each from about 5 to 25 mole percent.

Generally preferred units of Formula II include those where W is a chemical bond, Z groups of formulae (a) and (b) as defined above. For example, preferred polymer units of Formula II include those of the following Formula IIA:

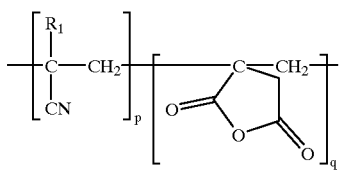

wherein $R^1$ is hydrogen or optionally substituted $C_{1-8}$ alkyl, particularly methyl or ethyl, and p and q are as defined above for Formula II.

It has been found that use of such cyano and itaconic anhydride moieties in combination provides surprising synergistic results.

In particular, photoresists that comprise a polymer that contains a combination of cyano and itaconic anhydride moieties exhibit excellent substrate adhesion and resolution of sub-0.20 μm features at 193 nm exposure. However, comparable photoresists that contain a polymer that contains cyano moieties, but no itaconic anhydride moieties exhibit comparatively poor substrate adhesion and inability to adequately resolve sub-0.20 μm features at 193 nm exposure. Similarly, comparable photoresists that comprise a polymer that contains itaconic anhydride moieties but no cyano groups exhibit poor substrate adhesion and inability to adequately resolve sub-0.20 μm features at 193 nm exposure. See, for instance, the results of Examples 5 and 6 below of photoresists of the invention relative to the results of comparative Examples 7 and 8.

Polymers of the invention may contain units in addition to those set forth in Formulae I and II above. For example, polymers may contain photoacid-labile moieties other than those shown in the above formulae, including photoacid-labile groups that do not contain a cyano moiety. Preferred photoacid-labile groups that may be incorporated into a polymer of the invention include pendant ester groups such as those of the Formula —WC(=O)OR$^5$, wherein W is a linker the same as defined above for Formulae I and II, and R⁵ is a suitable ester moiety such as an optionally substituted alkyl (including cycloalkyl) suitably having from 1 to about 20 carbons, more preferably about 4 to about 12 carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicylic group that contains one or more N, O or S atoms and one or more rings having from 4 to about 8 ring members such as tetrahydrofuranyl, thienyl, tetrahydropyranyl, morpholino and the like. Specifically preferred R⁵ groups include e.g. t-butyl, tetrahydropyran, ethoxyethyl, or an alicyclic group such as adamantyl including 2-methyl-2-adamantyl, norbornyl, isobornyl and the like.

Polymers of the invention optionally may contain other units such as groups that contribute to aqueous developability of a photoresist. For example, preferred polymer groups that contribute to aqueous developability contain carboxy or hydroxy moieties such as may be provided by condensation of acrylic acid, methacrylic acid, 2-hydroxyethylmethacrylate, or other monomers.

Other optional polymer units include those that may be provided by condensation of a vinyl alicyclic group, e.g. 2-adamantyl-2-methyl methacrylate, isobornyl methacrylate and the like, or a non-cyclic alkyl group such as t-butylmethacrylate and the like.

The invention also provides methods for forming relief images, including methods for forming a highly resolved relief image such as a pattern of lines where each line has essentially vertical sidewalls and a line width of about 0.40 microns or less, and even a width of about 0.25 or 0.20 microns or less. The invention furter provides articles of manufacture comprising substrates such as a microelectronic wafer substrate having coated thereon a polymer, photoresist or resist relief image of the invention. Other aspects of the invention are disclosed infra.

DETAILED DESCRIPTION OF THE INVENTION

Polymers of the invention can be prepared by a variety of methods. One suitable method is free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, dimethylformamide and the like. Suitable reaction temperatures for any particular system can be readily determined empirically by those skilled in the art based on the present disclosure.

Monomers that can be reacted to provide a polymer of the invention can be identified by those skilled in the art. For example, to provide units of Formula I, suitable monomers include e.g. cyano($C_{1-8}$alkylene) methacrylate or acrylate such as cyanoethyl methacrylate, cyanoethyl acrylate, cyanopropyl methacrylate, cyanopropyl acrylate, cyanobutyl methacrylate, cyanobutyl acrylate and the like.

To provide units of Formulae II, suitable monomers include e.g. acrylonitrile, methacrylonitrile, allylcyanide, itaconic anhydride and the like.

A variety of free radical initiators may be employed to prepare the copolymers of the invention. For example, azo compounds may be employed such as azo-bis-2,4-dimethylpentanenitrile. Peroxides, peresters, peracids and persulfates also could be employed.

See Examples 1 and 2 which follow for exemplary reagents and conditions for synthesis of polymers of the invention.

As discussed, W, W', X, Z, R, $R^1$, $R^2$, $R^3$ and $R^4$ groups as defined above are optionally substituted. A "substituted" W, W', X, Z, R, $R^1$, $R^2$, $R^3$ or $R^4$ group or other substituent may be substituted at one or more available positions, typically 1, 2, 3 or 4 positions by one or more suitable groups such as e.g. halogen (particularly F, Cl or Br); $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc.

In the above Formulae I and II, it will be understood that alkyl and alkenyl each may be cyclic or straight or branched non-cyclic chains, unless otherwise specified. Exemplary cyclic groups include cyclohexyl, isobornyl, norbornyl, adamantyl and the like.

Preferably a polymer of the invention will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Preferred polymers of the invention also preferably exhibit a sufficiently high $T_g$ to facilitate use of the polymer in a photoresist. Thus, preferably a polymer will have a $T_g$ greater than typical softbake (solvent removal) temperatures, e.g. a $T_g$ of greater than about 100° C., more preferably a $T_g$ of greater than about 110° C., still more preferably a $T_g$ of greater than about 120° C.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGS include imidosulfonates such as compounds of the following formula:

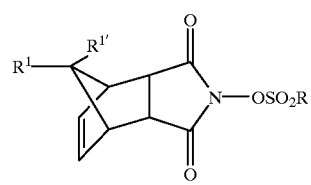

wherein R is camphor, adamantane, alkyl (e.g. $C_{1-12}$ alkyl) and perfluoroalkyl such as perfluoro($C_{1-12}$alkyl), particularly perfluoro anions of perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents are the following PAGS 1 and 2:

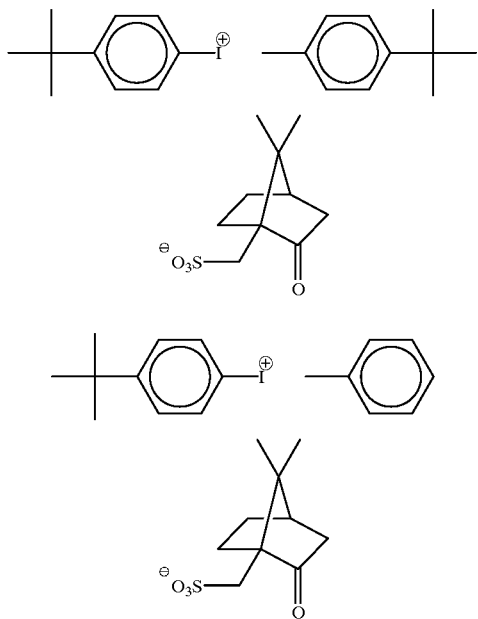

Such sulfonate compounds can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then (+/−)-10-camphorsulfonic acid added followed by neutralization with ammonium hydroxide. Sulfonate PAG 2 above can be prepared by the same procedures as disclose din that European Application, except approximately molar equivalents of t-butyl benzene and benzene would be reacted together in the first step with acetic anhydride and $KIO_3$.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Other known PAGS also may be employed in the resists of the invention. Generally preferred however, preferred PAGS do not contain aromatic groups, such as the above-mentioned imidosulfonates, in order to provide enhanced transparency at 193 nm or other short exposure wavelengths.

A preferred optional additive of resists of the invention is an added base, particularly tetrabutylammonium hydroxide (TBAH), or tetrabutylammonium lactate, which can enhance resolution of a developed resist relief image. The added base is suitably used in relatively small amounts, e.g. about 0.1 to 5 percent by weight relative to the photoactive component (PAG).

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

Coating layers of the resist compositions of the invention are preferably photoactivated by a short exposure wavelength, particularly a sub-200 nm exposure wavelength. A particularly preferred exposure wavelength is about 193 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylamrnmonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLES 1–2

Polymer Synthesis

Example 1.

Preparation of Polymer 1 of the invention. A polymer (Polymer 1) of the following structure 1 was prepared as described below.

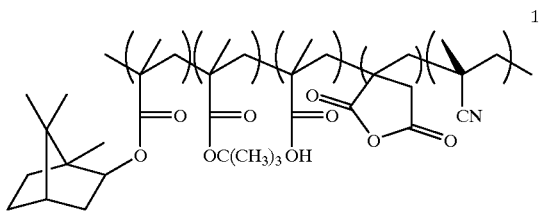

Polymer 1 (the methacrylonitrile containing pentapolymer 1 as shown immediately above) was prepared as follows. Isobornyl methacrylate (48.8 g, 0.217 mol), t-butyl methacrylate (20.5 g, 0.144 mol), methacrylonitrile (9.7 g, 0.144 mol), itaconic anhydride (12.2 g, 0.109 mol), and methacrylic acid (9.3 g, 0.108 mol) were dissolved in 175 ml of tetrahydrofuran. The reaction solution was then deoxygenated by gently bubbling a stream of $N_2$ through the stirring solution for 20 minutes, and then placing it under a blanket of $N_2$. The polymerization solution was then brought to a gentle reflux. 2,2-Azo-bis-2,4-dimethylpentanenitrile 8.95 g (0.0361 mol) dissolved in 25 ml of tetrahydroflran, was then added to the gently refluxing mixture over 5 minutes. The polymerization was then refluxed with stirring for 16 hours.

Upon completion of the polymerization the reaction was then cooled to room temperature, and the polymer isolated by precipitation into hexanes (3000 mL). The polymer was then filtered and washed well with hexanes. Finally the polymer was dried in a vacuum oven at 60° C. for 24 hours. Yield 80 g (80% of theory), $M_w$ 5283, $M_n$ 3473, $T_g$=129° C. and $T_d$=210° C.

Example 2.

Preparation of Polymer 2 of the invention. A polymer (Polymer 2) of the following structure 2 was prepared as described below.

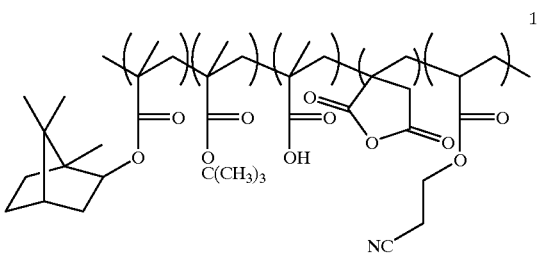

Polymer 2 (the cyanoethyl methacrylate containing pentapolymer 2 as depicted immediately above) was prepared as follows. Isobornyl methacrylate (13.17 g, 0.059 mol), t-butyl methacrylate (7.02 g, 0.049 mol), cyanoethyl methacrylate (3.72 g, 0.030 mol), itaconic anhydride (4.41 g, 0.039 mol), and methacrylic acid (1.70 g, 0.049 mol) were dissolved in 50 ml of tetrahydrofuiran. The reaction solution was then deoxygenated by gently bubbling a stream of $N_2$ through the stirring solution for 20 minutes, and then placing it under a blanket of $N_2$. The polymerization solution was then brought to a previously been coated with an antireflective coating according to manufacturer's instructions (DUV-30, Brewerscience) at approximately 3000 rpm and baked on a hotplate at 125° C. for 60 seconds to give a coating of thickness 450 nm, exposed at 45 mJ/cm$^2$, hotplate baked at 155° C. and puddle developed for 90 seconds in 2.38% tetramethylammonium hydroxide to give a resolution of 150 nm. Good substrate adhesion and no trace of lithographic feature swelling were observed.

Example 6

Photoresist Preparation and Lithographic Processing

The same photoresist formulation (and component amounts) and processes as described in Example 5 were used, except that Polymer 2 (of the structure and prepared as described in Example 2 above) was used in place of Polymer 1. A resolution of 160 nm was observed with good substrate adhesion and no feature swelling.

Example 7 (comparative example)

The same photoresist formulation and processes of Example 5 were used, except that the Comparative Polymer 1 (prepared as described in Example 3 above) was used in place of Polymer 1. Resolution could not be ascertained because of adhesion failure.

Example 8 (comparative example)

The same photoresist formulation and processes of Example 5 were used, except that the Comparative Polymer 2 (prepared as described in Example 4 above) was used in place of Polymer 1. Significant adhesion failure was observed. In addition, resolution was limited to 300 nm because of swelling of resist features.

The foregoing description of the invention is merely illustrative thereof, and it is understood that variations and modification can be made without departing from the spirit or scope of the invention as set forth in the following claims.

What is claimed is:

1. A photoresist composition comprising a photoactive component and a resin binder comprising a polymer that comprises photoacid-labile units corresponding to the following Formula I

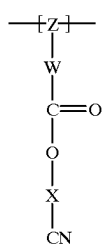

and itaconic anhyDride; wherein
W is a linker group;
X is optionally substituted alkylene, optionally substitued alkenylene, or optionally substituted alkynylene; and
Z is a bridge group between the polymer units.

2. The photoresist of claim 1 wherein the polymer comprises units that contribute to aqueous developability of the photoresist.

3. The photoresist of claim 1 wherein the photoresist comprises less than about 1 mole percent of aromatic groups.

4. The photoresist of claim 1 wherein the photoresist is completely free of aromatic groups.

5. A photoresist composition comprising a photoactive component and a pentapolymer that comprises units corresponding to the following Formula II:

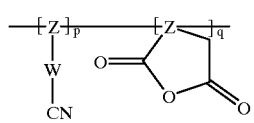

and at least one unit selected from photoacid-labile groups that comprise a cyano moiety, photoacid-labile groups that do not contain a cyano moiety or groups that contribute to aqueous developability,
wherein W is a linker group;
the Z groups are the same or different and each is a polymer bridge group; and
p and q mole percents of the respective polymer units and p and q are each from about 5 to about 35 mole percent, based on the total units of the polymer.

6. The photoresist of claim 5 wherein the polymer comprises photoacid-labile groups that comprise a cyano moiety.

7. The photoresist of claim 5 wherein the polymer comprises photoacid-labile groups that do not contain a cyano moiety.

8. The photoresist of claim 5 wherein the polymer comprises units that contribute to aqueous developability of the photoresist.

9. The photoresist of claim 5 wherein the photoresist comprises less than about 1 mole percent of aromatic groups.

10. The photoresist of claim 5 wherein the photoresist is completely free of aromatic groups.

11. The photoresist of claim 5 wherein the polymer comprises units corresponding to the following Formula IIA:

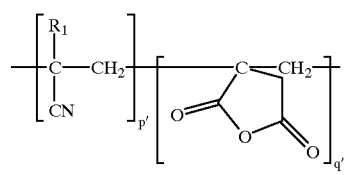

wherein $R^1$ is hydrogen or optionally substituted $C_{1-4}$ alkyl; and p' and q' are mole percents of the respective polymer units and p' and q' are each about 5 to about 35 mole percent, based on the total units of the polymer.

12. The photoresist of claim 11 where $R^1$ is methyl.

13. The photoresist of claim 5 wherein the photoactive component is a sulfonate compound.

14. The photoresist of claim 5 wherein the photoactive component is an imidosulfonate compound.

15. The photoresist of claim 5 wherein the photoactive compound comprises a perfluoroalkyl sulfonate group.

16. The photoresist composition of claim 1 wherein the photoactive component is a sulfonate photoacid generator.

17. The photoresist of claim 16 wherein the photoacid generator is an imidosulfonate compound.

18. The photoresist of claim 16 wherein the photoacid generator comprises a perfluoroalkyl sulfonate group.

19. The photoresist of claim 16 wherein the photoresist comprises less than about 1 mole percent of aromatic groups.

20. An article of manufacture comprising a microelectronic wafer substrate having coated thereon a layer of the photoresist composition of claim 1.

21. An article of manufacture comprising a microelectronic wafer substrate having coated thereon a layer of the photoresist composition of claim 5.

22. An article of manufacture comprising a microelectronic wafer substrate having coated thereon a layer of the photoresist composition of claim 16.

* * * * *